United States Patent
Kawata

(10) Patent No.: US 10,256,913 B2
(45) Date of Patent: Apr. 9, 2019

(54) OPTICAL DRIVING DEVICE AND OPTICAL COMMUNICATION SYSTEM

(71) Applicant: RENESAS ELECTRONICS CORPORATION, Tokyo (JP)

(72) Inventor: Seiji Kawata, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/981,579

(22) Filed: May 16, 2018

(65) Prior Publication Data
US 2019/0007141 A1 Jan. 3, 2019

(30) Foreign Application Priority Data
Jun. 29, 2017 (JP) .................................. 2017-127812

(51) Int. Cl.
*H01S 5/042* (2006.01)
*H03K 5/135* (2006.01)
(Continued)

(52) U.S. Cl.
CPC ......... *H04B 10/505* (2013.01); *H01S 5/0427* (2013.01); *H03K 5/135* (2013.01);
(Continued)

(58) Field of Classification Search
CPC ... H04B 10/505; H04B 10/508; H01S 5/0427; H01S 5/0261; H01S 5/323; H03K 5/135;
(Continued)

(56) References Cited

U.S. PATENT DOCUMENTS 7,516,897 B1 * 4/2009 Hussain .................. H01S 5/042
235/462.42
8,948,608 B1 * 2/2015 Pobanz .................. H04B 10/25
398/183
(Continued)

FOREIGN PATENT DOCUMENTS

JP 2016-122898 A 7/2016

OTHER PUBLICATIONS

H. Fujita et al., "25 Gbit/s Optical Transmitter Modules for Optical Transceiver", SEI Technical Review, No. 186, Jan. 2015, pp. 65-68.
(Continued)

*Primary Examiner* — Dalzid E Singh
(74) *Attorney, Agent, or Firm* — McDermott Will & Emery LLP

(57) ABSTRACT

An optical driving device and an optical communication system are provided which can improve signal quality of laser light that uses a PAM method. A laser driver drives a semiconductor laser by using an N-level (N is an integer of 3 or more) PAM signal. A clock control circuit determines a driving timing of the laser driver. In a case where N=4, for example, the clock control circuit determines a driving timing in association with a transition of the PAM signal from a fourth level to a first level to be earlier than a driving timing in association with a transition in an opposite direction by a first time, assuming that levels are the first level, . . . , and the fourth level in an order from a level at which light intensity is minimum.

15 Claims, 14 Drawing Sheets

(51) Int. Cl.
- *H04L 25/49* (2006.01)
- *H04B 10/50* (2013.01)
- *H04B 10/508* (2013.01)
- *H03K 5/00* (2006.01)
- *H01S 5/323* (2006.01)
- *H01S 5/026* (2006.01)

(52) U.S. Cl.
CPC ....... *H04B 10/508* (2013.01); *H04L 25/4917* (2013.01); *H01S 5/0261* (2013.01); *H01S 5/323* (2013.01); *H03K 2005/00058* (2013.01); *H03K 2005/00267* (2013.01)

(58) Field of Classification Search
CPC .......... H03K 2005/00058; H03K 2005/00267; H04L 25/4917
USPC .......................................................... 398/118
See application file for complete search history.

(56) References Cited

U.S. PATENT DOCUMENTS

| | | | |
|---|---|---|---|
| 2007/0291620 A1* | 12/2007 | Yu ........................ | G11B 7/0943 369/116 |
| 2014/0169789 A1* | 6/2014 | Bhoja .................. | H04B 10/541 398/45 |
| 2015/0222359 A1* | 8/2015 | Kai ..................... | H04B 10/2575 398/115 |
| 2018/0205465 A1* | 7/2018 | Tanaka ................. | H04B 10/524 |

OTHER PUBLICATIONS

T. Saeki et al., "Compact Optical Transmitter Module with Integrated Optical Multiplexer for 100 Gbit/s", SEI Technical Review, No. 188, Jan. 2016, pp. 95-98.

* cited by examiner

| | DRIVING CURRENT OF DRIVER (WHEN TRANSMISSION DATA (DTs) IS "00 10 01 11 00 10 00") |
|---|---|
| EMBODIMENT | CK2 ⎍⎍⎍⎍⎍⎍⎍⎍<br>←Te<br>Id — LV4, LV3, LV2, LV1<br>DTp([1],[2]) (0,0) (1,0) (0,1) (1,1) (0,0) (1,0) (0,0) |
| COMPARATIVE EXAMPLE | CK1 ⎍⎍⎍⎍⎍⎍⎍⎍<br>Id — LV4, LV3, LV2, LV1<br>DTp([1],[2]) (0,0) (1,0) (0,1) (1,1) (0,0) (1,0) (0,0) |

OPTICAL DRIVING DEVICE AND OPTICAL COMMUNICATION SYSTEM

CROSS-REFERENCE TO RELATED APPLICATIONS

The disclosure of Japanese Patent Application No. 2017-127812 filed on Jun. 29, 2017 including the specification, drawings and abstract is incorporated herein by reference in its entirety.

BACKGROUND

The present invention relates to an optical driving device and an optical communication system, and relates to a technique for transmitting laser light modulated in a PAM (Pulse Amplitude Modulation) method, for example.

Japanese Unexamined Patent Application Publication No. 2016-122898 describes a DML (Directly Modulated Laser) driver for PAM. The DML driver includes a current drawing circuit for every bit of a digital input signal, and draws a current corresponding to the digital input signal from a constant current supplied to an LD (Laser Diode) by the current drawing circuit, thereby driving the LD. "25 Gbit/s Optical Transmitter Modules for Optical Transceiver", SEI Technical Review, No. 186, January 2015, pp. 65-68 describes an optical transmission module with an EA modulator-integrated DFB laser mounted therein. "Compact Optical Transmitter Module with Integrated Optical Multiplexer for 100 Gbit/s", SEI Technical Review, No. 188, pp. 95-98 describes an optical transmission module with a directly modulated DFB laser mounted therein.

SUMMARY

The transmission capacity and the transmission speed of the Internet are required to be further improved with increase of high-definition video distribution, for example. Therefore, as a laser light modulation method development of a PAM method is being advanced in place of a conventional NRZ (No Return to Zero) method. For example, 400 Gigabit Ethernet (registered trademark) uses PAM4 that performs four-level PAM modulation. Meanwhile, as a structure of a semiconductor laser, there are known an EML (Electro absorption Modulator integrated with DFB Laser) type described in "25 Gbit/s Optical Transmitter Modules for Optical Transceiver" and a DML (Directly Modulated Laser) type described in "Compact Optical Transmitter Module with Integrated Optical Multiplexer for 100 Gbit/s".

The EML type is also called an external modulation type, and uses a method that always drives a semiconductor laser at a maximum output and performs intensity modulation for laser light thereof by using an optical modulator integrated in the semiconductor laser. Therefore, the EML type has a problem of large power consumption. For example, energy consumption is increased with increase of a data center or a communication base station, which may result in global warming or the like. Meanwhile, the DML type is a direct modulation type and uses a method that modulates a driving current itself of a semiconductor laser. Therefore, power consumption can be reduced as compared with the EML type. However, distortion of a signal waveform in the DML type is larger than in the EMI type. Therefore, especially in a case of using the PAM method, it is likely that sufficient signal quality is not obtained.

Embodiments described later have been made in view of the above problems. Other objects and novel features will be apparent from the description of this specification and the accompanying drawings.

An optical driving device according to an embodiment includes a laser driver that drives a direct modulation type semiconductor laser and a clock control circuit. The laser driver drives the semiconductor laser by using an N-level (N is an integer of 3 or more) PAM signal. The clock control circuit determines a driving timing of the laser driver. In this determination, the clock control circuit assumes that levels are a first level, . . . , and an N-th level in the order from a level at which light intensity is minimum, and determines a driving timing in association with a transition from the N-th level to the first level to be earlier than a driving timing in association with a transition in the opposite direction by a first time.

According to the aforementioned embodiment, it is possible to improve signal quality of laser light using a PAM method.

DETAILED DESCRIPTION

The following embodiments will be described while being divided into a plurality of sections or embodiments, if necessary for the sake of convenience. However, unless otherwise specified, these are not independent of each other, but are in a relation such that one is a modification, details, complementary explanation, or the like of a part or the whole of the other. In the following embodiments, when a reference is made to the number of elements and the like (including number, numerical value, quantity, range, and the like), the number of elements is not limited to the specific number, but may be the specific number or more or less, unless otherwise specified, or except the case where the number is apparently limited to the specific number in principle, or except for other cases.

Further, in the following embodiments, the constitutional elements (including element steps or the like) are not always essential, unless otherwise specified, or except the case where they are apparently considered essential in principle, or except for other cases. Similarly, in the following embodiments, when a reference is made to the shapes, positional relationships, or the like of the constitutional elements or the like, it is understood that they include ones substantially analogous or similar to the shapes or the like, unless otherwise specified, or unless otherwise considered apparently in principle, or except for other cases. These are also the same for the foregoing numerical value or range.

In addition, a circuit element constituting each functional block in an embodiment is not specifically limited, but is formed on a substrate of semiconductor, such as single crystal silicon, by a known technique for an integrated circuit, such as CMOS (complementary MOS transistor).

Embodiments of the present invention are described in detail below, with reference to the drawings. Throughout the drawings for explaining the embodiments, the same component is labeled with the same reference sign in principle and repetition of the description is omitted.

First Embodiment

<<Schematic Configuration of Optical Communication System>>

Figure 1:
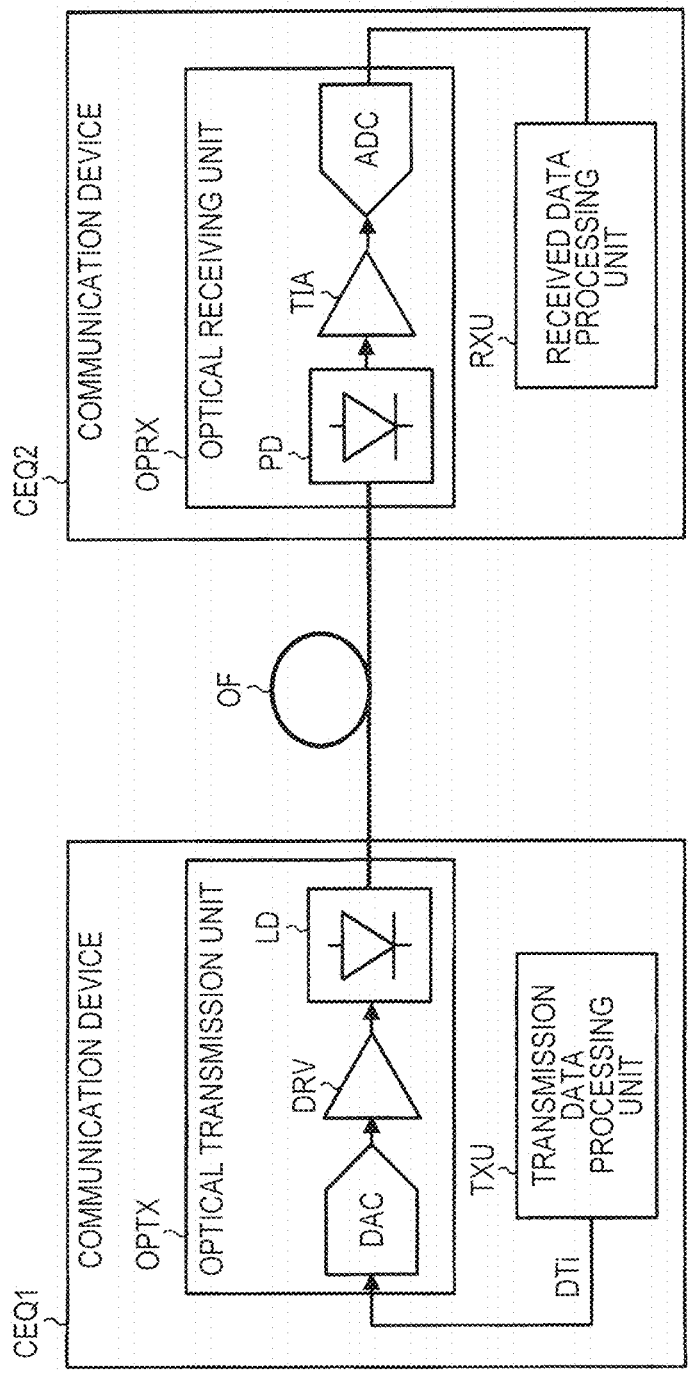
FIG. 1 is a schematic diagram illustrating a configuration example of a main portion of an optical communication system according to a first embodiment of the present invention.

FIG. 1 is a schematic diagram illustrating a configuration example of a main portion of an optical communication system according to a first embodiment of the present invention. The optical communication system illustrated in FIG. 1 includes two communication devices CEQ1 and CEQ2 and an optical fiber OF serving as a communication path between the communication devices CEQ1 and CEQ2. The communication device CEQ1 includes an optical transmission unit (optical transmission device) OPTX and a transmission data processing unit TXU. The transmission data processing unit TXU performs various kinds of digital processing, such as coding, by a DSP (Digital Signal Processor) or the like for original digital data and outputs processed digital data DTi.

The optical transmission unit (optical transmission device) OPTX includes a digital-to-analog converter DAC, a laser driver DRV, and a semiconductor laser LD. The semiconductor laser LD has a direct modulation type structure. The digital-to-analog converter DAC converts the digital data DTi to a four-level PAM signal (analog signal). The laser driver DRV drives the semiconductor laser LD by using the PAM signal. As a result, the semiconductor laser LD transmits laser light modulated with the PAM signal to the optical fiber OF.

The communication device CEQ2 includes an optical receiving unit (optical receiving device) OPRX and a received data processing unit RXU. The optical receiving unit (optical receiving device) OPRX includes a photodiode PD, a transimpedance amplifier TIA, and an analog-to-digital converter ADC. The photodiode PD receives laser light from the optical fiber OF and outputs a current signal corresponding to its light intensity. The transimpedance amplifier TIA amplifies the current signal with a predetermined gain and converts the current signal to a voltage signal. The analog-to-digital converter ADC converts the voltage signal (analog signal) to digital data. In this manner, the optical receiving unit OPRX demodulates laser light modulated with a PAM signal. The received data processing unit RXU performs various kinds of digital processing, such as decoding, by a DSP or the like for digital data from the optical receiving unit OPRX, thereby restoring the digital data to original digital data.

Actually, for two-way communication, the optical transmission unit OPTX and the optical receiving unit OPRX are integrated into one transmission/receiving module, and this transmission/receiving module is provided in each of the communication devices CEQ1 and CEQ2. Further, in 400 Gigabit Ethernet, for example, a plurality of transmission/receiving modules are used while being bundled in parallel, and a plurality of laser light beams therefrom are transmitted through the optical fiber OF while being multiplexed with each other by WDM (Wavelength Division Multiplexing). Therefore, in various kinds of communication devices, such as a router, an Ethernet switch, an optical transmission device, and a video distribution server, a percentage of the transmission/receiving module in the overall power consumption becomes large. Accordingly, to reduce the power consumption, it is useful to use a direct modulation type (DML type) semiconductor laser LD.

Figure 12:
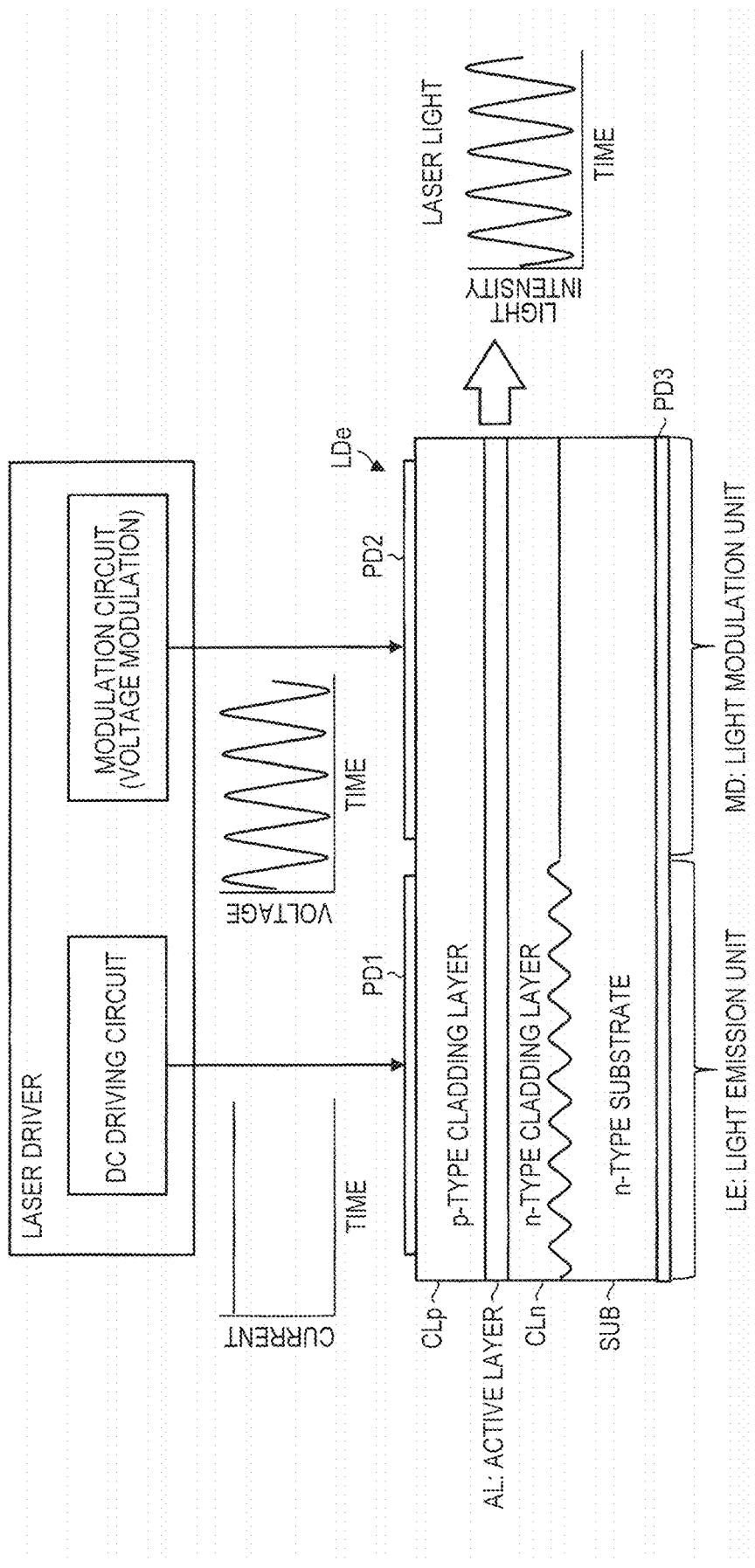
FIG. 12 is a schematic diagram illustrating a cross-sectional structure example and an operation example of an EML type semiconductor laser.
Figure 13:
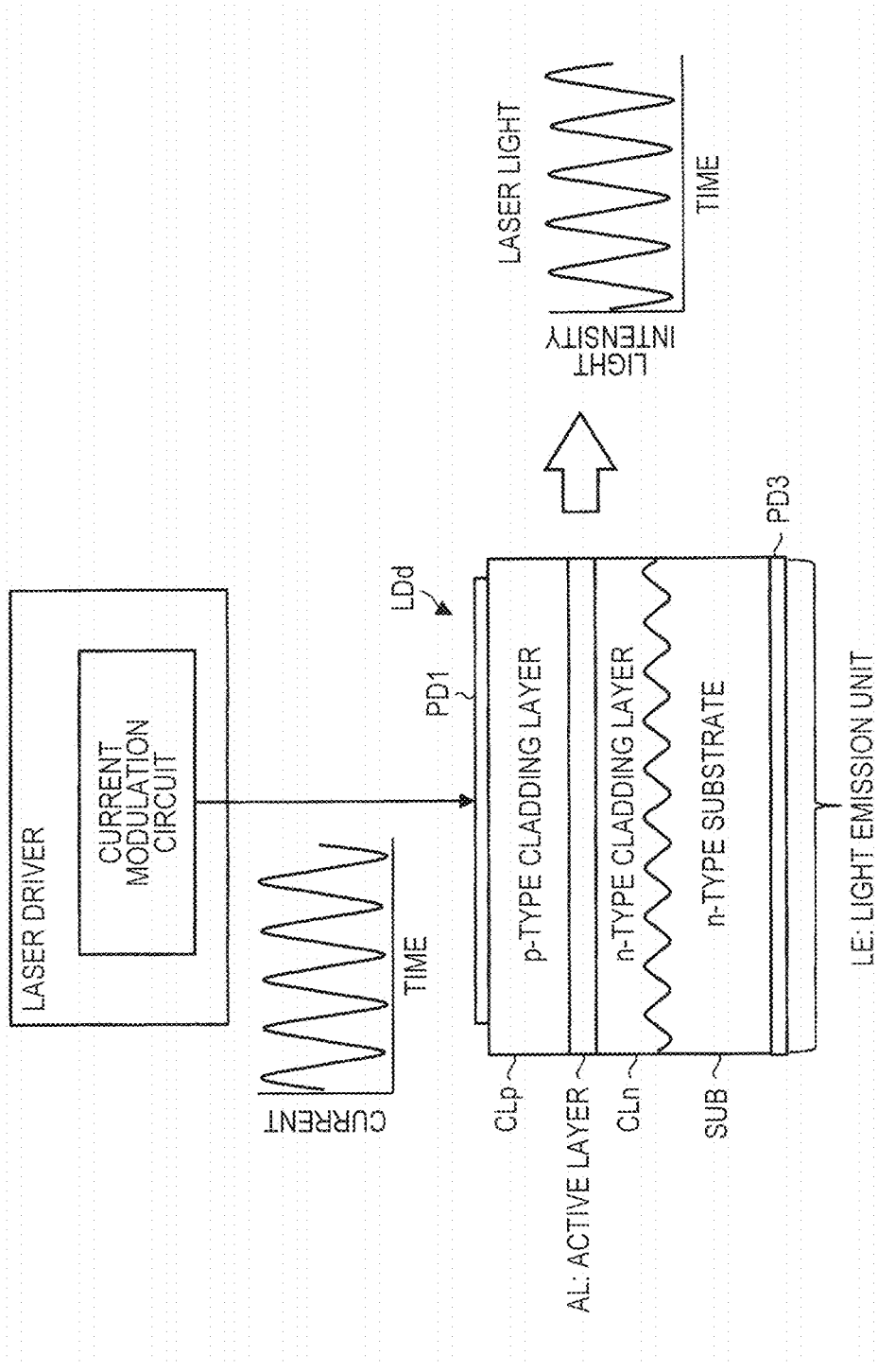
FIG. 13 is a schematic diagram illustrating a cross-sectional structure example and an operation example of a DML type semiconductor laser.

FIG. 12 is a schematic diagram illustrating a cross-sectional structure example and an operation example of an EML type semiconductor laser. FIG. 13 is a schematic diagram illustrating a cross-sectional structure example and an operation example of a DML type semiconductor laser. The EML type semiconductor laser LDe illustrated in FIG. 12 has a structure in which a light emission unit LE and a light modulation unit MD are arranged to be adjacent to each other. An electrode PD3 is formed on the back of an n-type semiconductor substrate SUB. On a main surface of the semiconductor substrate SUB, an n-type cladding layer CLn, an active layer AL, and a p-type cladding layer CLp are formed in this order.

Each of the n-type cladding layer CLn, the active layer AL, and the p-type cladding layer CLp is formed of compound semiconductor, such as indium phosphide (InP), and has a double heterostructure, for example. On a main-surface side of the p-type cladding layer CLp, an electrode PD1 is formed in a region of the light emission unit LE and an electrode PD2 is formed in a region of the light modulation unit MD. In addition, a diffraction grating for making laser light have a single wavelength is formed in the region of the light emission unit LE on the boundary between the semiconductor substrate SUB and the n-type cladding layer CLn.

A DC current is supplied to the electrode PD1 by the laser driver. Thus, electrons and holes are confined in the active layer AL, and recombination thereof causes light emission. This light causes laser oscillation by stimulated emission within the active layer AL. Consequently, laser light with a single wavelength is transmitted to the light modulation unit MD. A voltage modulated by the laser driver is applied to the electrode PD2. Consequently, an absorption rate of laser light is changed by the quantum confined Stark effect, and modulated laser light is output to the outside.

The DML type (direct modulation type) semiconductor laser LDd illustrated in FIG. 13 has a configuration that only includes the light emission unit LE illustrated in FIG. 12. A current signal modulated by a laser driver is supplied to the electrode PD1. Thus, modulated laser light with a single wavelength is output to the outside. While a DC current corresponding to the maximum output is always supplied to the light emission unit LE in the EML type semiconductor laser LDe illustrated in FIG. 12, a modulated current signal is supplied to the light emission unit LE in the DML type semiconductor laser LDd illustrated in FIG. 13. Thus, power consumption can be reduced by using the DML type semiconductor laser LDd.

<<Schematic Configuration of Optical Driving Device (Comparative Example) and Problems>>

Figure 14:
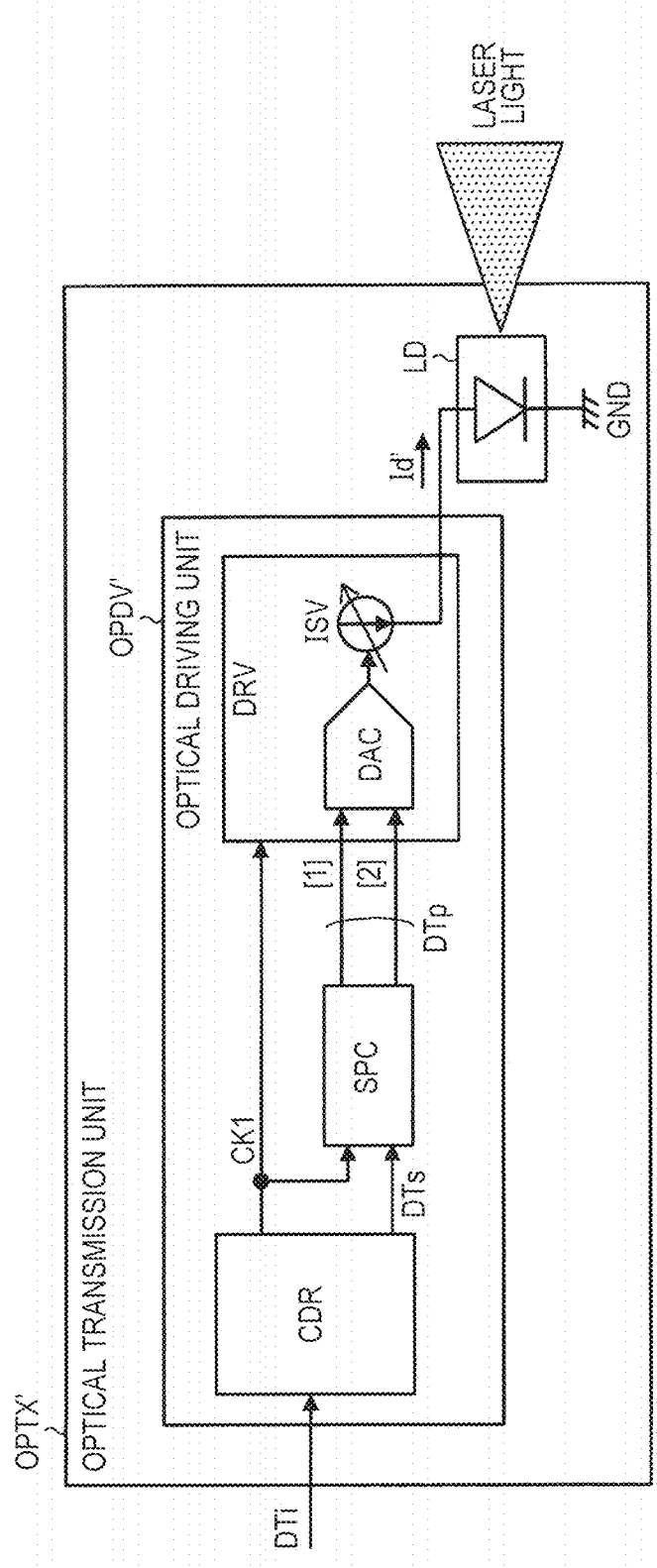
FIG. 14 is a circuit block diagram illustrating a schematic configuration example of a main portion including an optical driving device studied as a comparative example of the present invention.

FIG. 14 is a circuit block diagram illustrating a schematic configuration example of a main portion including an optical driving device studied as a comparative example of the present invention. FIG. 14 illustrates a more detailed configuration example of the optical transmission unit illustrated in FIG. 1. This optical transmission unit (optical transmission device) OPTX' includes a semiconductor laser LD and an optical driving unit (optical driving device) OPDV' that drives the semiconductor laser LD. The optical driving unit (optical driving device) OPDV' is constituted by a single semiconductor chip, for example, and includes a clock and data recovery circuit CDR, a serial-to-parallel converter SPC, and a laser driver DRV. This example assumes a case where a DML type semiconductor laser is modulated with a four-level PAM signal.

The clock and data recovery circuit CDR receives digital data DTi from the transmission data processing unit TXU illustrated in FIG. 1, and performs extraction of a clock signal CK1 and restoration (retiming) of serial data DTs. The serial-to-parallel converter SPC converts the serial data DTs to 2-bit parallel data DTp[1] and DTp[2]. The laser driver DRV includes a digital-to-analog converter DAC and a variable current source ISV. In this example, the digital-to-analog converter DAC illustrated in FIG. 1 is included in the laser driver DRV.

The digital-to-analog converter DAC converts the 2-bit parallel data DTp[1] and DTp[2] from the serial-to-parallel converter SPC to a four-level analog signal (i.e., a PAM signal). The variable current source ISV generates a current signal Id' corresponding to a level of the PAM signal and drives the semiconductor laser LD with the current signal Id' (in other words, the PAM signal). In this driving, a driving timing of the semiconductor laser LD is determined based on the clock signal CK1 from the clock and data recovery circuit CDR.

Figure 15:
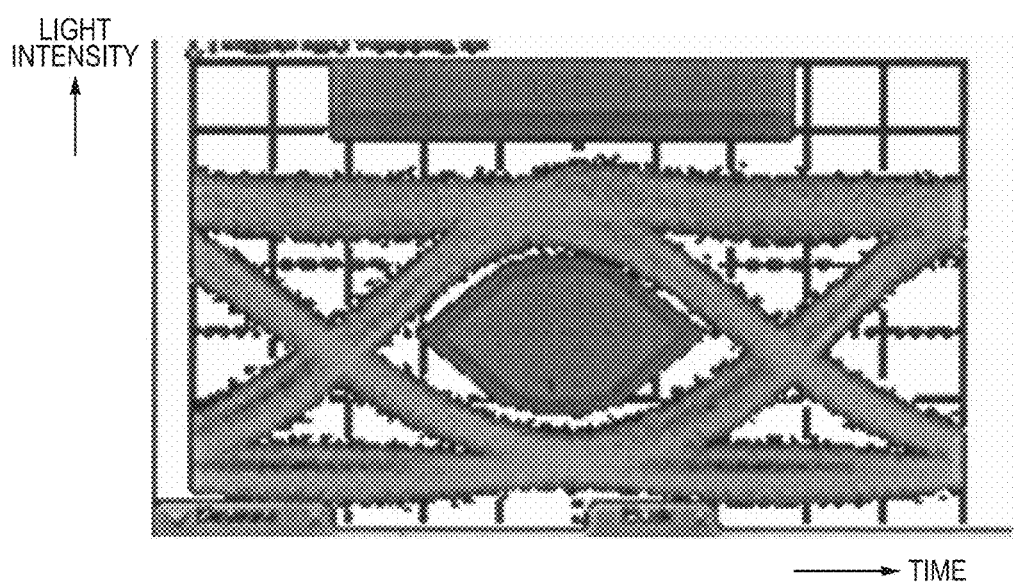
FIG. 15 is a waveform chart illustrating an example of an observation result of laser light output from a DML type semiconductor laser.

FIG. 15 is a waveform chart illustrating an example of an observation result of laser light output from a DML type semiconductor laser. FIG. 15 illustrates an eye pattern in a case where modulation is performed by using a binary NRZ signal assuming a transmission rate to be 25 Gbps. In FIG. 15, it is found that, when a rising time (a slope of rising) of laser light and a falling time (a slope of falling) thereof are compared with each other, the falling time is longer (i.e., the slope of falling is dull). The factor therefor can be considered as follows, for example. First, the rising time is determined by a time of recombination of electrons and holes while many electrons and many holes are injected into the active layer AL. Meanwhile, the falling time is determined by a time of recombination while the electrons and the holes are reduced in the active layer AL because of recombination in a state where injection of the electrons and the holes is not performed. In this case, a probability of recombination is reduced with time, and therefore falling requires much time.

Figure 16A:
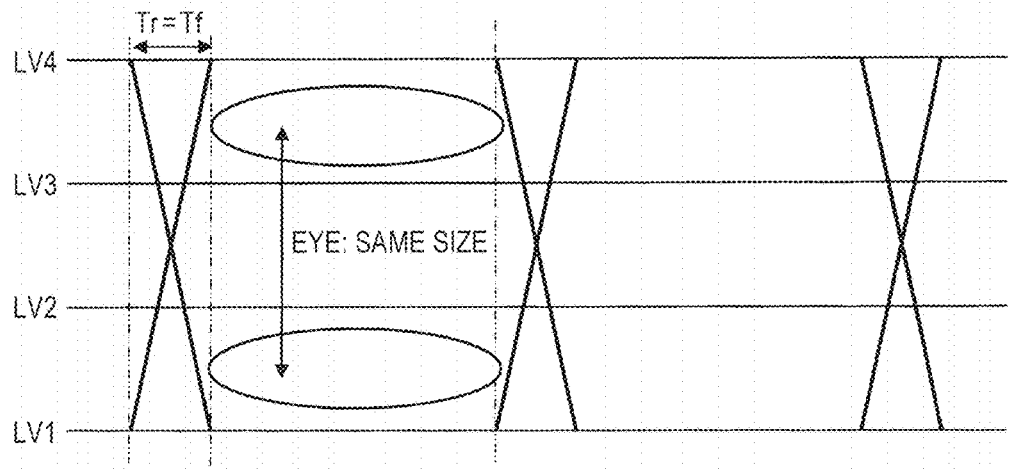
FIG. 16A schematically illustrates an ideal waveform of laser light, and FIG. 16B schematically illustrates a waveform of laser light output from the semiconductor laser in FIG. 14.
Figure 16B:
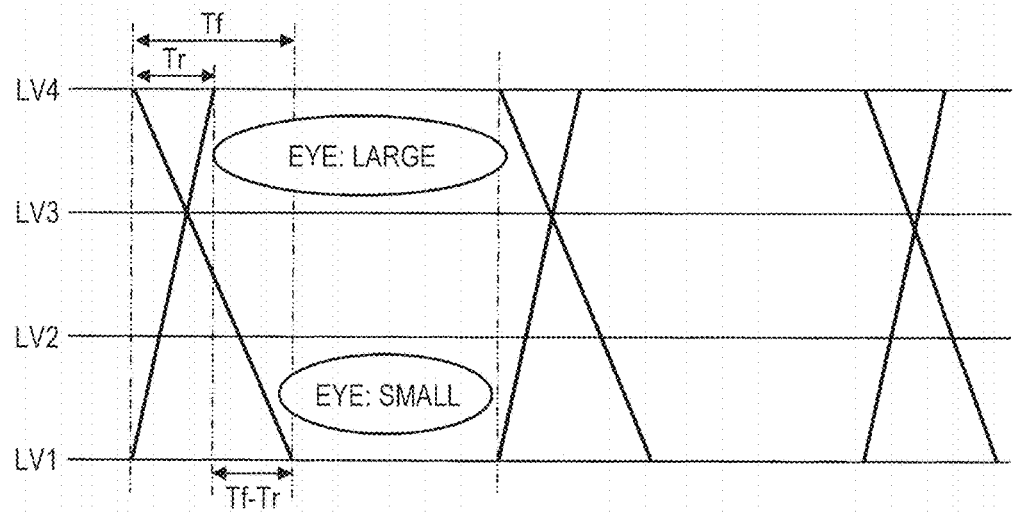

FIG. 16A schematically illustrates an ideal waveform of laser light, and FIG. 16B schematically illustrates a waveform of laser light output from the semiconductor laser in FIG. 14. In this specification, four levels are referred to as a first level LV1, a second level LV2, a third level LV3, and a fourth level LV4 in the order from the level at which light intensity is minimum. In addition, a time required for a transition from the first level LV1 that is the minimum level to the fourth level LV4 that is the maximum level is referred to as a rising time Tr, and a time required for a transition from the fourth level LV4 to the first level LV1 is referred to as a falling time Tf.

In FIGS. 16A and 16B, three eyes are open in association with the four levels, which are between the fourth level LV4 and the third level LV3 (an upper eye), between the third level LV3 and the second level LV2 (an intermediate eye), and between the second level LV2 and the first level LV1 (a lower eye). In FIG. 16A, the rising time Tr and the falling time Tf are equal to each other. In this case, the size of the intermediate eye is larger than those of the upper eye and the lower eye, and the upper eye and the lower eye are equal to each other in size. For example, in a case of using the EML type semiconductor laser LDe illustrated in FIG. 12, these eyes can be easily obtained.

Meanwhile, in FIG. 16B, because of the DML type semiconductor laser, the falling time Tf is longer than the rising time Tr. Further, a driving timing at falling (a start timing) and a driving timing at rising are equal to each other based on the clock signal CK1 illustrated in FIG. 14. In this case, because the lower eye is smaller than the upper eye in size, the signal quality of laser light incident on the optical fiber OF is lowered. Also, in the optical fiber OF in FIG. 1, the signal quality is lowered more as the fiber length is longer. As a result, in the optical receiving unit OPRX in FIG. 1, it is likely that the lower eye cannot be demodulated correctly (that is, false recognition of data occurs) or the length of the optical fiber OF (a transmission distance) is limited to such a length that correct demodulation can be performed.

<<Schematic Configuration and Schematic Operation of Optical Driving Device (First Embodiment)>>

Figure 2:
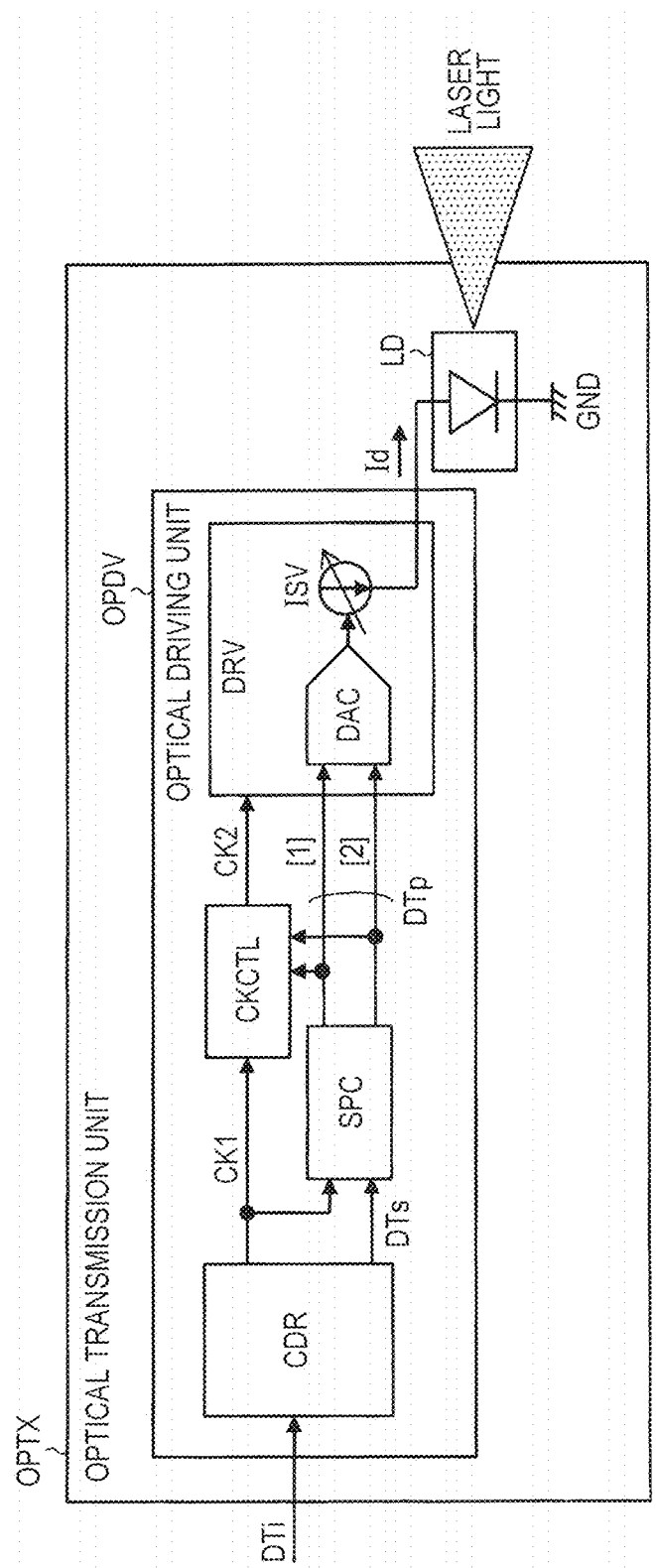
FIG. 2 is a circuit block diagram illustrating a schematic configuration example of a main portion including an optical driving device according to the first embodiment of the present invention.

FIG. 2 is a circuit block diagram illustrating a schematic configuration example of a main portion including an optical driving device according to the first embodiment of the present invention. FIG. 2 illustrates a more detailed configuration example of the optical transmission unit illustrated in FIG. 1. This optical transmission unit (optical transmission device) OPTX includes a semiconductor laser LD and an optical driving unit (optical driving device) OPDV that drives the semiconductor laser LD, as in the case of FIG. 14. The optical driving unit (optical driving device) OPDV is constituted by a single semiconductor chip, for example, includes a clock and data recovery circuit CDR, a serial-to-parallel converter SPC, and a laser driver DRV as in the case of FIG. 14, and also includes a clock control circuit CKCTL.

The clock control circuit CKCTL receives a clock signal CK1 from the clock and data recovery circuit CDR and parallel data DTp[1] and DTp[2] from the serial-to-parallel converter SPC, and generates a clock signal CK2. The clock control circuit CKCTL then determines a driving timing of the laser driver DRV by the clock signal CK2.

Figure 3A:
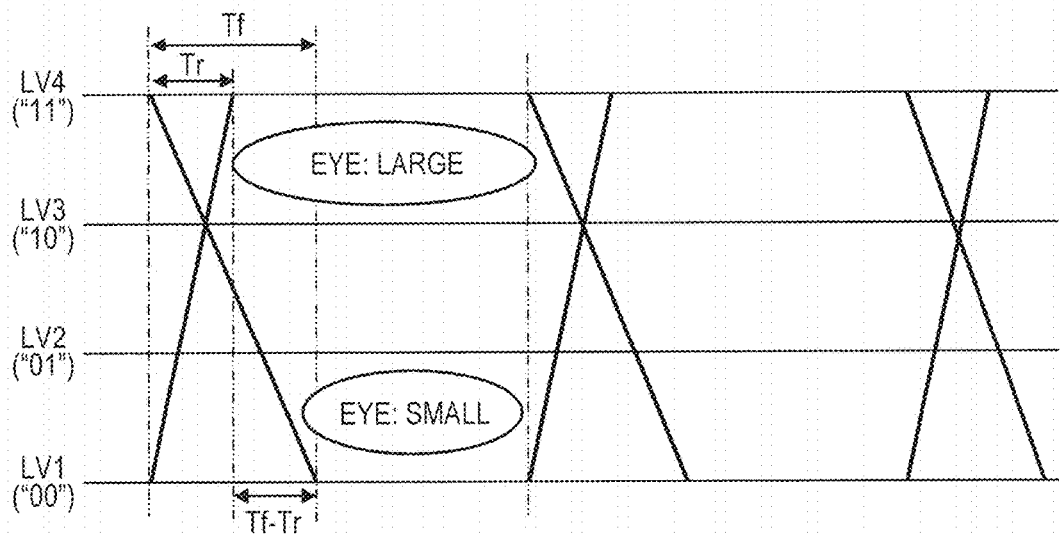
FIG. 3A schematically illustrates a waveform of laser light output from a semiconductor laser in FIG. 14, and FIG. 3B schematically illustrates a waveform of laser light output from a semiconductor laser in FIG. 2.
Figure 3B:
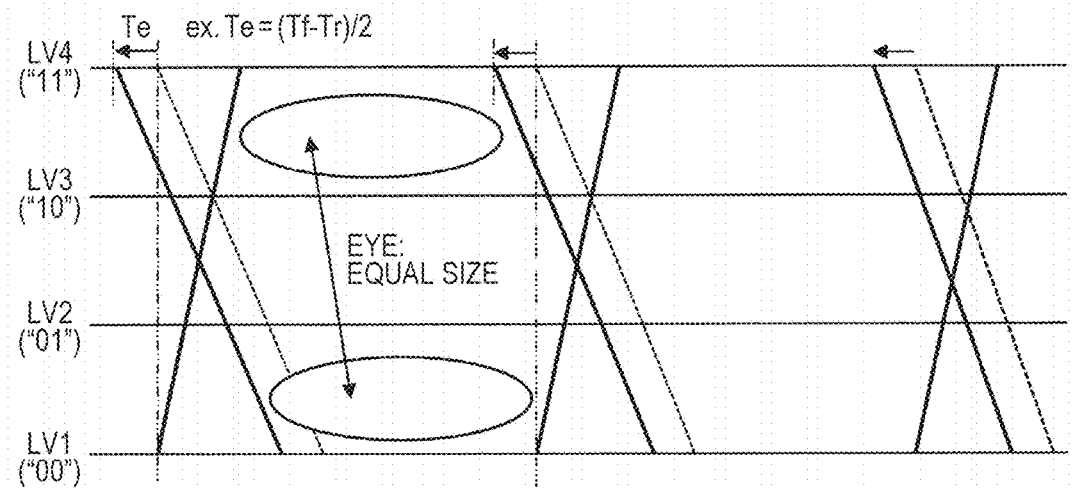

FIG. 3A schematically illustrates a waveform of laser light output from the semiconductor laser in FIG. 14. FIG. 3B schematically illustrates a waveform of laser light output from the semiconductor laser in FIG. 2. In this example, the first level LV1, the second level LV2, the third level LV3, and the fourth level LV4 respectively correspond to (0, 0), (0, 1), (1, 0), and (1, 1) of the parallel data (DTp[1], DTp[2]) in FIG. 2.

FIG. 3A illustrates a similar waveform to that in the case of FIG. 16B, in which the size of a lower eye is smaller than that of an upper eye. Thus, the clock control circuit CKCTL determines a driving timing in association with a transition from the fourth level LV4 to the first level LV1 (a start timing of a transition) to be earlier than a driving timing in association with a transition from the first level LV1 to the fourth level LV4 by a time Te. That is, the clock control circuit CKCTL generates the clock signal CK2 to achieve the above-described timing.

Here, the time Te is "(Tf−Tr)/2", for example. In the case of FIG. 3A, the width of the fourth level LV4 in the upper eye is wider than the width of the first level LV1 in the lower eye by "Tf−Tr". Determining the time Te to be "(Tf−Tr)/2", the width of the fourth level LV4 is reduced by "(Tf−Tr)/2" and the width of the first level LV1 is increased by "(Tf−Tr)/2". As a result, it is possible to determine the sizes of the lower eye and the upper eye to be equal to each other.

Figure 4A:
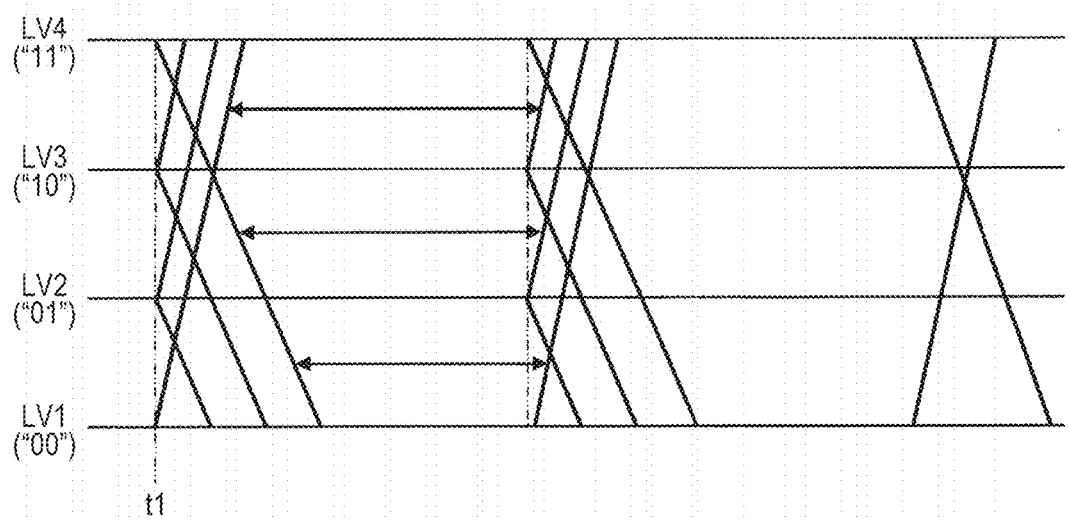
FIGS. 4A and 4B schematically illustrate waveforms corresponding to those in FIGS. 3A and 3B with transitions between other levels added thereto, respectively.
Figure 4B:
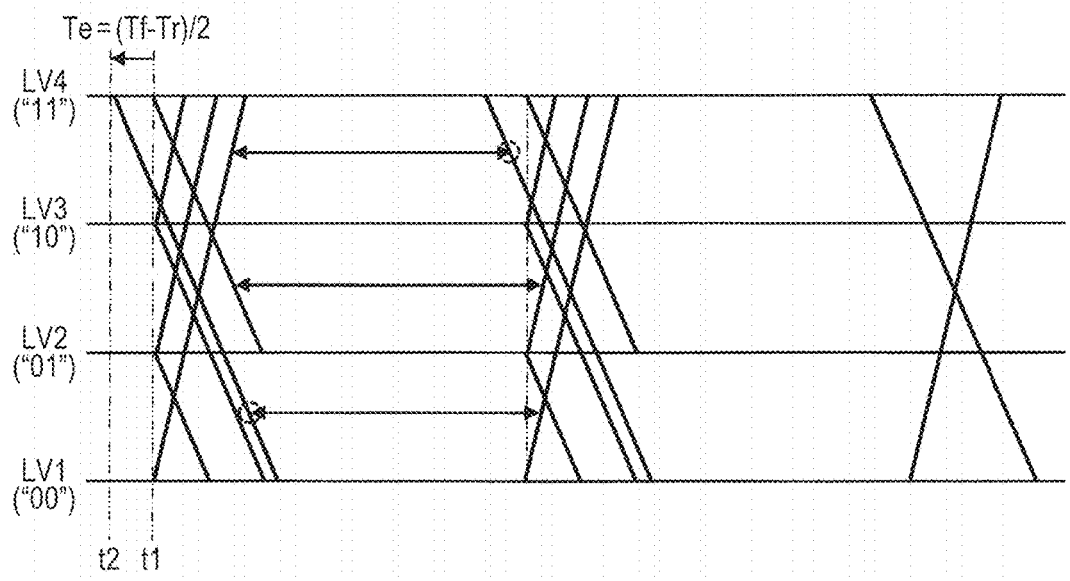

FIGS. 4A and 4B schematically illustrate waveforms corresponding to those in FIGS. 3A and 3B with other transitions between levels added thereto (so-called eye patterns), respectively. As illustrated in FIG. 4B, the clock control circuit CKCTL determines all driving timings in association with other transitions than the transition from the fourth level LV4 to the first level LV1 to be a timing t1. The clock control circuit CKCTL only determines the driving timing in association with the transition from the fourth level LV4 to the first level LV1 to be a timing t2 that is earlier than the timing t1 by the time Te. The other transitions include transitions from the first level to the second, third, and fourth levels, transitions from the second level to the first, third, and fourth levels, transitions from the third level to the first, second, and fourth levels, and transitions from the fourth level to the second and third levels.

As illustrated in FIG. 4B, the size of the lower eye is dominated by the transition from the fourth level LV4 to the first level LV1. Therefore, by only making this transition earlier, it is possible to set the size of the lower eye and that of the upper eye to be equal to each other. Because each level is a threshold value of the semiconductor laser LD or more, a variation of start timings in the respective transitions (that is, a variation depending on between which levels a transition occurs) is small. Therefore, when a timing is made earlier by the time Te, it is not necessary to consider a level of a second previous clock cycle, but it suffices that only a level of a previous clock cycle (the fourth level LV4) and a level of a current clock cycle (the first level LV1) are considered.

If a timing in a rising direction is adjusted, this adjustment causes a position of relaxation oscillation to be shifted, which may adversely affect opening in a vertical direction of an eye. Meanwhile, according to the method of the first embodiment, a timing in a falling direction is adjusted. Therefore, the position of relaxation oscillation and therefore the opening in the vertical direction of the eye are not affected. The adjustment is performed in a transverse direction (a time-axis direction) only. Therefore, no side effect is caused by the adjustment of the timing in the falling direction.

Although a four-level PAM signal is described as an example, the number of levels is not necessarily limited to four. In a case of using an N-level (N is an integer of 3 or more) PAM signal, for example, a three-level or five or more level PAM signal, a similar problem can occur. Therefore, it is useful to apply a similar method.

However, in a case where "N" is large, when a transition from the N-th level to the first level is made earlier by the time Te (=(Tf−Tr)/2) in FIG. 4B, for example, a waveform of that transition may pass a waveform of a transition from the (N−1)th level to the first level LV1. In this case, the size of the lower eye is dominated by the transition from the (N−1)th level to the first level LV1. Therefore, in this case, the time Te can be determined in such a manner that the waveform of the transition from the N-th level to the first level does not pass the waveform of the transition from the (N−1)th level to the first level LV1 but coincides with the latter one, or the waveform of the transition from the (N−1)th level to the first level LV1 can be also made earlier in addition to the waveform of the transition from the N-th level to the first level LV1.

<<Detailed Configuration and Detailed Operation of Optical Driving Device (First Embodiment)>>

Figure 5A:
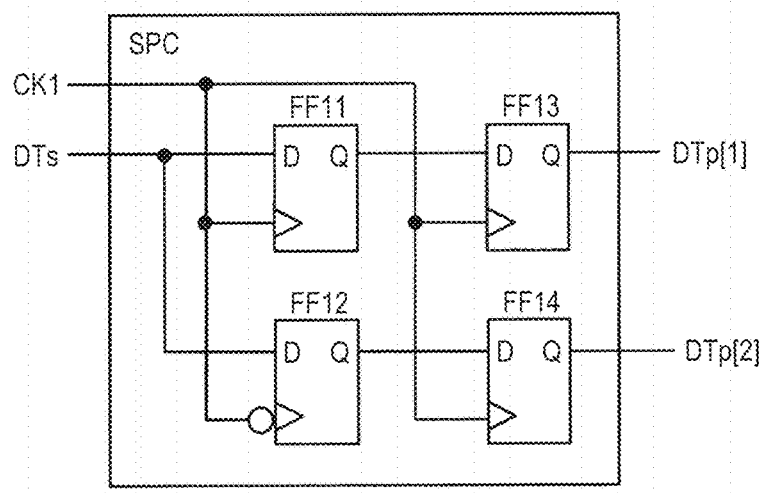
FIG. 5A is a circuit diagram illustrating a configuration example of a serial-to-parallel converter in FIG. 2.
Figure 5B:
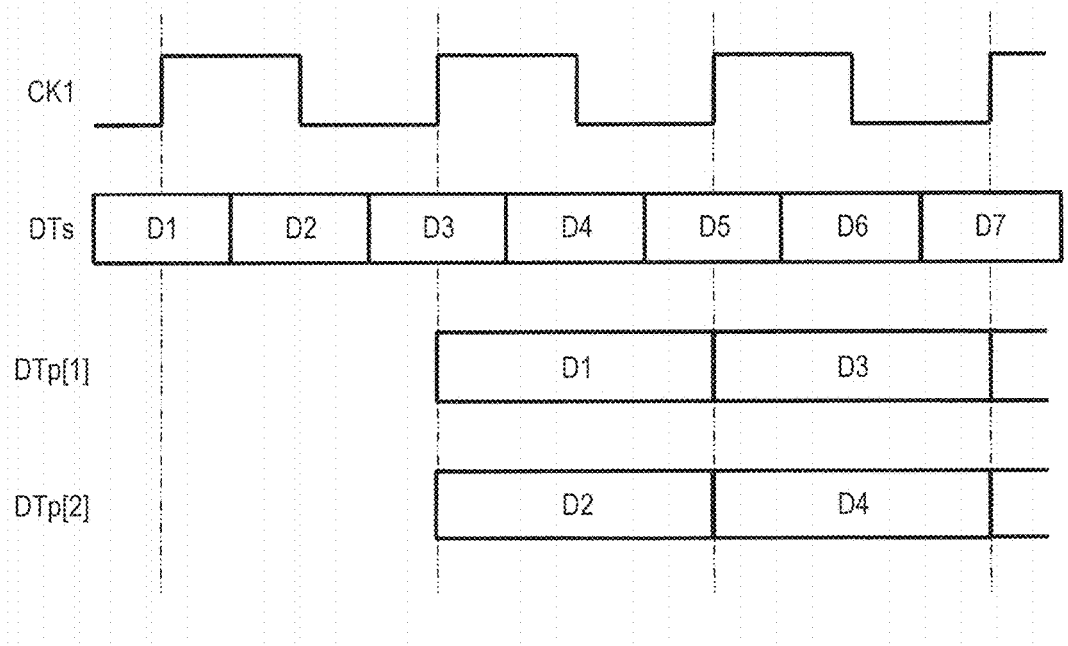
FIG. 5B is a timing chart illustrating an operation example of the serial-to-parallel converter in FIG. 5A.

FIG. 5A is a circuit diagram illustrating a configuration example of the serial-to-parallel converter in FIG. 2, and FIG. 5B is a timing chart illustrating an operation example of the serial-to-parallel converter in FIG. 5A. The serial-to-parallel converter SPC in FIG. 5A includes flip-flop circuits FF11 to FF14. The flip-flop circuits FF11 and FF12 latch serial data DTs at a rising edge and a falling edge of a clock signal CK1. The flip-flop circuits FF13 and FF14 perform retiming of outputs of the flip-flop circuits FF11 and FF12 at a rising edge the clock signal CK1, thereby outputting parallel data DTp[1] and DTp[2], respectively.

In the example of FIG. 5B, the serial data DTs is input in the order of D1, D2, D3, D4, . . . . In this case, D1 and D2 are output as the parallel data DTp[1] and DTp[2] in synchronization with a rising edge of the clock signal CK1, and D3 and D4 are output as the parallel data DTp[1] and DTp[2] in synchronization with a next rising edge. A similar operation is performed for the subsequent data.

Figure 6A:
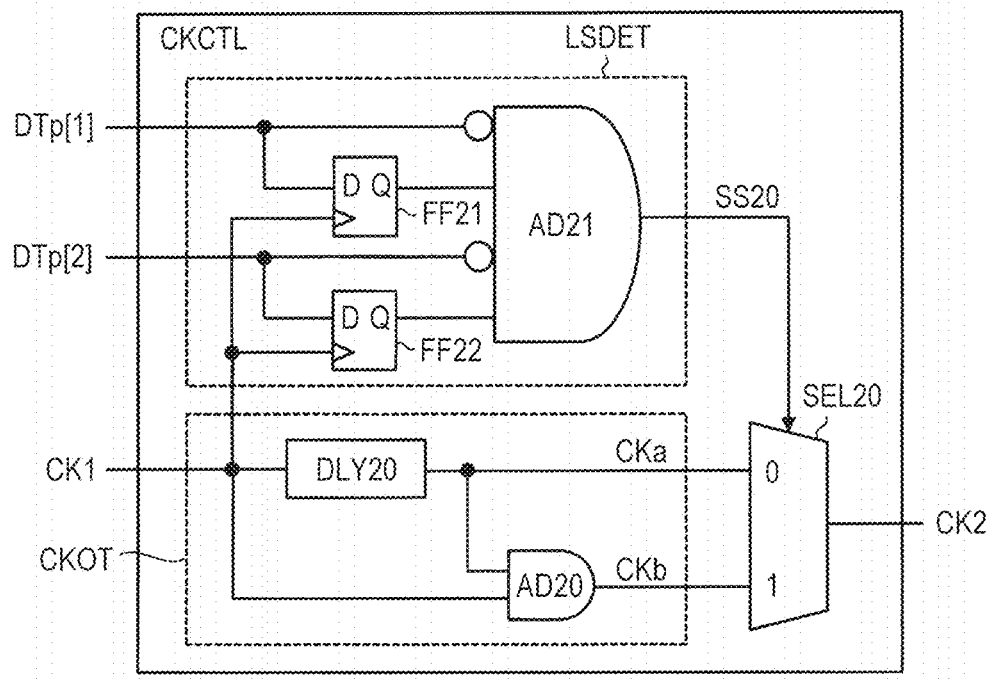
FIG. 6A is a circuit diagram illustrating a configuration example of a clock control circuit in FIG. 2.
Figure 6B:
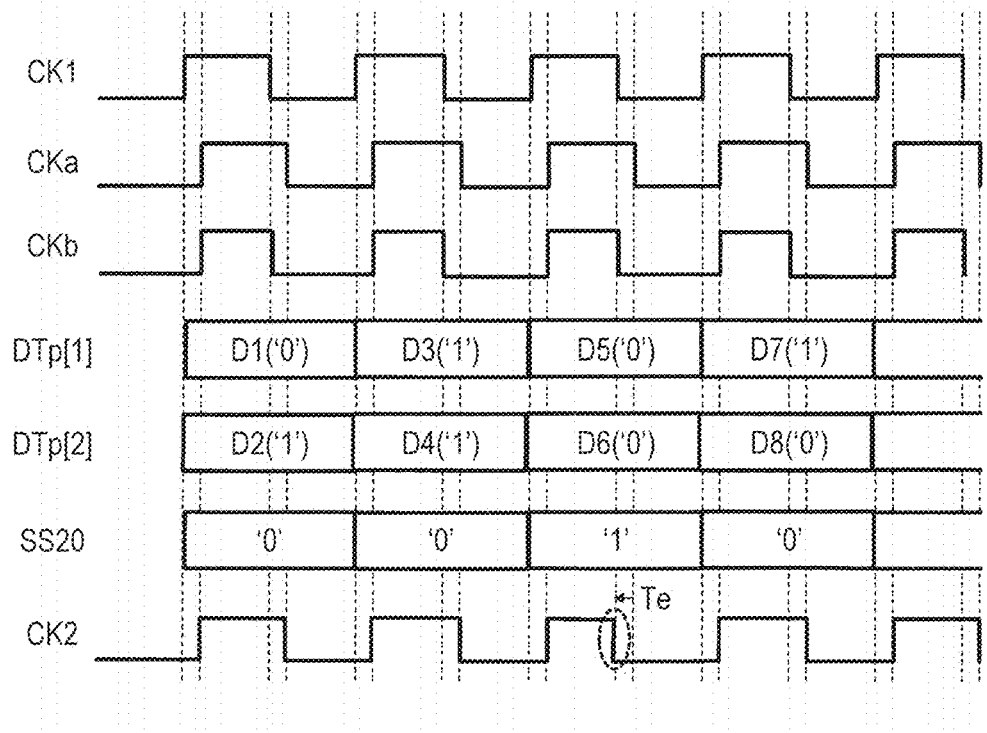
FIG. 6B is a timing chart illustrating an operation example of the clock control circuit in FIG. 6A.

FIG. 6A is a circuit diagram illustrating a configuration example of a clock control circuit in FIG. 2, and FIG. 6B is a timing chart illustrating an operation example of the clock control circuit in FIG. 6A. The clock control circuit CKCTL in FIG. 6A includes a clock output circuit CKOT, a selection circuit SEL20, and a level-transition detection circuit LSDET. The clock output circuit CKOT includes a delay circuit DLY20 that determines the time Te illustrated in FIG. 4B and the like, and outputs a clock signal CKa corresponding to the timing t1 in FIG. 4B and a clock signal CKb corresponding to the timing t2.

In this example, the clock output circuit CKOT outputs the clock signal CKa by delaying the clock signal CK1 by the delay circuit DLY20, and outputs the clock signal CKb by performing an AND operation of the clock signal CKa and the clock signal CK1 by an AND gate AD20. In this case, as illustrated in FIG. 6B, a falling edge of the clock signal CKb is earlier than a falling edge of the clock signal CKa by the time Te.

The selection circuit SEL20 selects one of the clock signal CKa and the clock signal CKb. The level-transition detection circuit LSDET detects a clock cycle in which a transition from the fourth level LV4 to the first level LV1 occurs, and controls the selection circuit SEL20 with the detection result. In this example, the level-transition detection circuit LSDET includes flip-flop circuits FF21 and FF22 and an AND gate AD21.

The flip-flop circuits FF21 and FF22 latch parallel data DTp[1] and DTp[2] at a rising edge the clock signal CK1, thereby delaying the parallel data DTp[1] and DTp[2] by one clock cycle, respectively. The AND gate AD21 asserts a selection signal SS20 at level '1' in a case where the outputs of the flip-flop circuits FF21 and FF22 (that is, parallel data (DTp[1] and DTp[2]) in a previous clock cycle) are (1, 1) and parallel data (DTp[1] and DTp[2]) in a current clock cycle are (0, 0). The selection circuit SEL20 outputs the clock signal CKb as the clock signal CK2 when the selection signal SS20 is at level '1', and outputs the clock signal CKa as the clock signal CK2 when the selection signal SS20 is at level '0'.

In FIG. 6B, (D1, D2)=(0, 1), (D3, D4)=(1, 1), (D5, D6)=(0, 0), and (D7, D8)=(1, 0) are input in that order in respective clock cycles of the clock signal CK1. In this case, the selection signal SS20 is asserted to be at level '1' in the clock cycle of (D5, D6). In this clock cycle, the clock signal CK2 of which the falling edge is earlier than those in previous and subsequent cycles by the time Te, is output.

Although this example uses a configuration that makes a falling edge earlier as the clock output circuit CKOT, a configuration that makes a rising edge earlier can be used. In this case, the selection circuit SEL20 can select one of the clock signal CK1 and the clock signal CKa, for example. In any case, the clock output circuit CKOT can output a clock signal and another clock signal of which an edge is earlier than that of the former one, by including the delay circuit DLY20.

Figure 7:
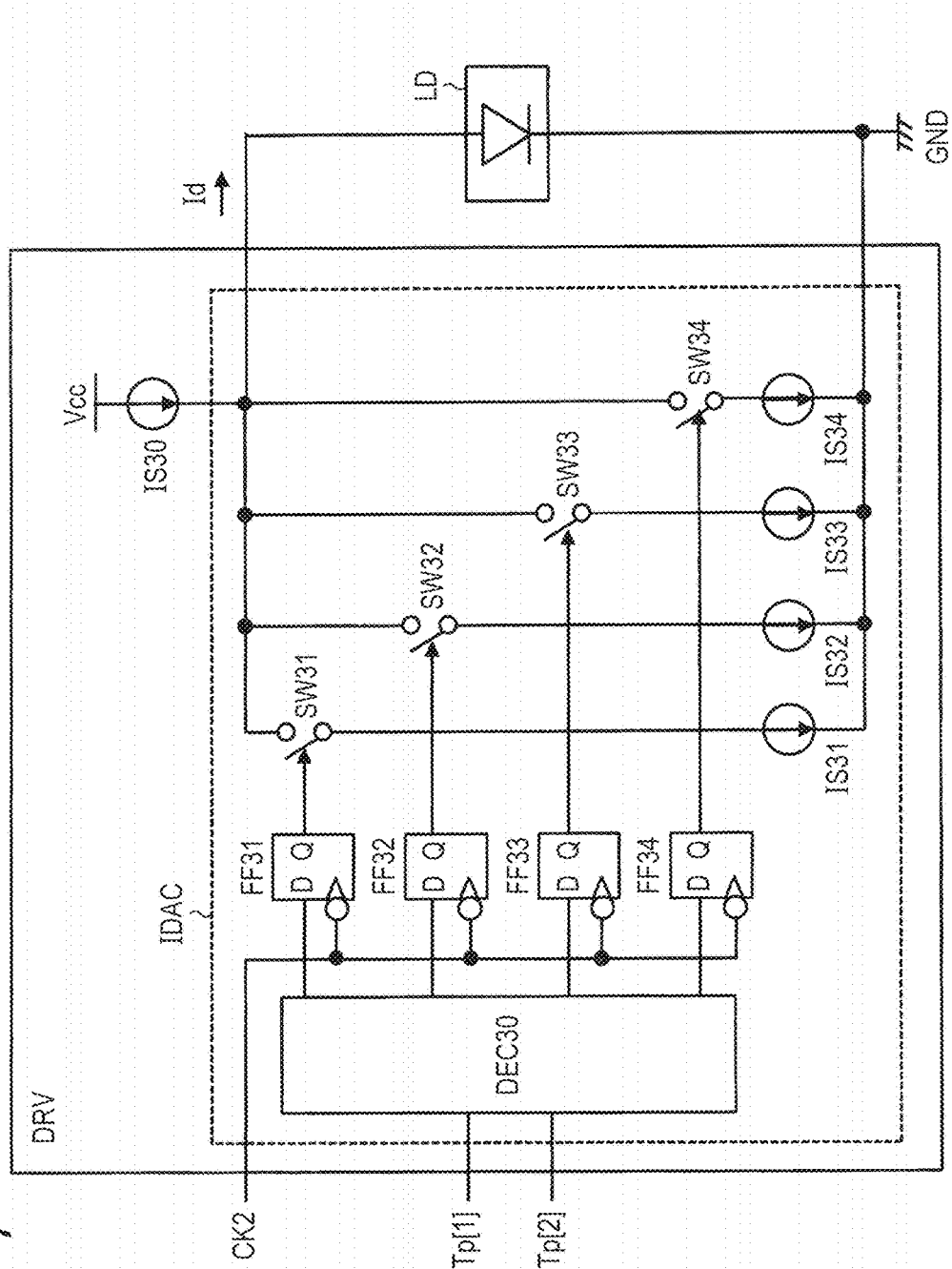
FIG. 7 is a circuit diagram illustrating a configuration example of a laser driver in FIG. 2.

FIG. 7 is a circuit diagram illustrating a configuration example of a laser driver in FIG. 2. The laser driver DRV illustrated in FIG. 7 includes a current-control digital-to-analog converter IDAC and a constant current source IS30. The current-control digital-to-analog converter IDAC includes a decoder DEC30, flip-flop circuits FF31 to FF34, switches SW31 to SW34, and constant current sources IS31 to IS34. The decoder DEC30 decodes parallel data DTp[1] and DTp[2] and outputs the decoding result to the flip-flop circuits FF31 to FF34. Specifically, the decoder DEC30 outputs level '1' only to the flip-flop circuit FF34 when parallel data (DTp[1], DTp[2]) is (1, 1), and outputs level '1' only to the flip-flop circuit FF31 when parallel data (DTp[1], DTp[2]) is (0, 0), for example.

The flip-flop circuits FF31 to FF34 latch the decoding result of the decoder DEC30 at a falling edge of the clock signal CK2, and control turning on and off of the switches SW31 to SW34 with the outputs of those flip-flop circuits FF31 to FF34, respectively. As a result, referring to FIG. 6B, for example, when parallel data (DTp[1], DTp[2]) is (1, 1), only the switch SW34 is controlled to be turned on at a normal timing. Thereafter, when a transition of parallel data is made to (0, 0), only the switch SW31 is controlled to be turned on at a timing earlier by the time Te.

Constant current values of the constant current sources IS31 to IS34 satisfy the relation of IS31>IS32>IS33>IS34. As a result, when only the switch SW34 is controlled to be turned on, the maximum driving current Id that is determined by a difference between the constant current value of the constant current source IS30 and the constant current value of the constant current source IS34 is supplied to the semiconductor laser LD. Subsequently, when only the switch SW31 is controlled to be turned on, the minimum driving current Id that is determined by a difference between the constant current value of the constant current source IS30 and the constant current value of the constant current source IS31 is supplied to the semiconductor laser LD.

Although the configuration example including the current control digital-to-analog converter IDAC is described as the laser driver DRV, the laser driver DRV is not specifically limited thereto. Various configurations can be applied to the laser driver DRV. For example, a configuration can be employed in which an analog voltage is generated by a voltage control digital-to-analog converter at a falling edge of the clock signal CK2 and that analog voltage is applied to a gate of a MOS transistor serving as a variable current source. In addition, the falling edge of the clock signal CK2 is used in this example. However, a change can be made as appropriate to use arising edge as described with reference to FIG. 6B.

Figures 8, 9:
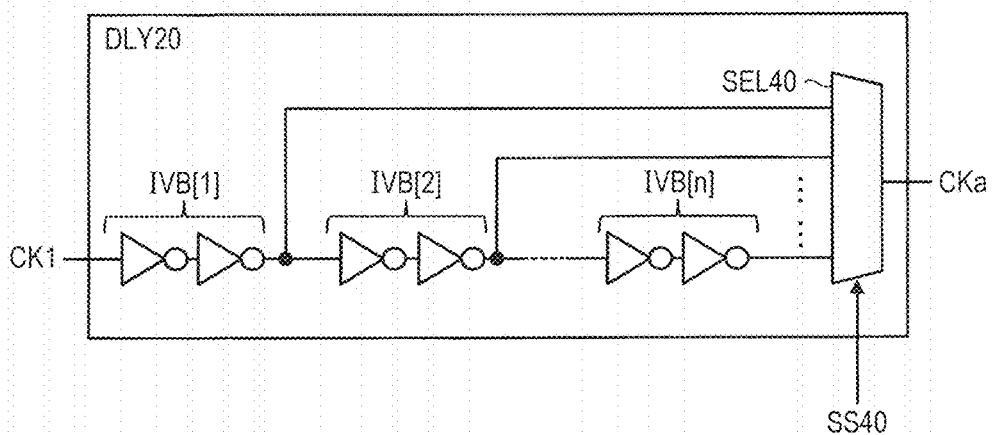
FIG. 8 is a timing chart illustrating an operation example of the laser driver in FIGS. 2 and 7.
FIG. 9 is a circuit diagram illustrating a configuration example of a delay circuit in FIG. 6A.

FIG. 8 is a timing chart illustrating an operation example of the laser driver in FIGS. 2 and 7. An operation example of the laser driver in the comparative example illustrated in FIG. 14 is also illustrated together. First, the laser driver DRV in FIG. 14 causes a transition of a driving current Id of the semiconductor laser in accordance with a falling edge of the clock signal CK1. As a result, all driving timings in association with transitions between levels (start timings of the transitions) are the same. Meanwhile, the laser driver DRV in FIGS. 2 and 7 causes a transition of the driving current Id of the semiconductor laser LD in accordance with a falling edge of the clock signal CK2. As a result, it is possible to make a driving timing in association with a transition (a start timing of the transition) from the fourth level LV4 to the first level LV1 earlier by the time Te.

FIG. 9 is a circuit diagram illustrating a configuration example of a" delay circuit in FIG. 6A. The delay circuit DLY20 illustrated in FIG. 9 is a variable delay circuit in which the time Te can be variably set. The delay circuit DLY20 includes a plurality of inverter circuit blocks IVB[1], IVB[2], . . . , IVB[n] coupled in series in that order and a selection circuit SEL40, for example. Each inverter circuit block is constituted by an even-number of inverter circuits, for example. A clock signal CK1 is input to the inverter circuit block IVB[1]. The selection circuit SEL40 selects an output of any of the inverter circuit blocks IVB[1], IVB[2], . . . , IVB[n] based on a selection signal SS40, and outputs the selected output as a clock signal CKa.

For example, it is possible to combine various DML type semiconductor lasers LD with the optical driving unit OPDV in FIG. 2. In this case, the optimum time Te can vary in accordance with the semiconductor laser LD to be combined. Also, the optimum time Te can vary in accordance with an environmental change, such as a temperature change. Therefore, it is useful to enable the time Te to be variably set based on the selection signal SS40, by using the variable delay circuit as illustrated in FIG. 9.

<<Main Advantageous Effects of First Embodiment>>

By using the method of the first embodiment in the aforementioned manner, it is typically possible to reduce power consumption and improve signal quality of laser light using a PAM method. As a result, improvement of a transmission distance can be achieved, for example. Further, those advantageous effects can be obtained by adding a simple circuit as illustrated in FIG. 6A.

Second Embodiment

<<Schematic Operation of Clock Control Circuit (Modification)>>

Figure 10:
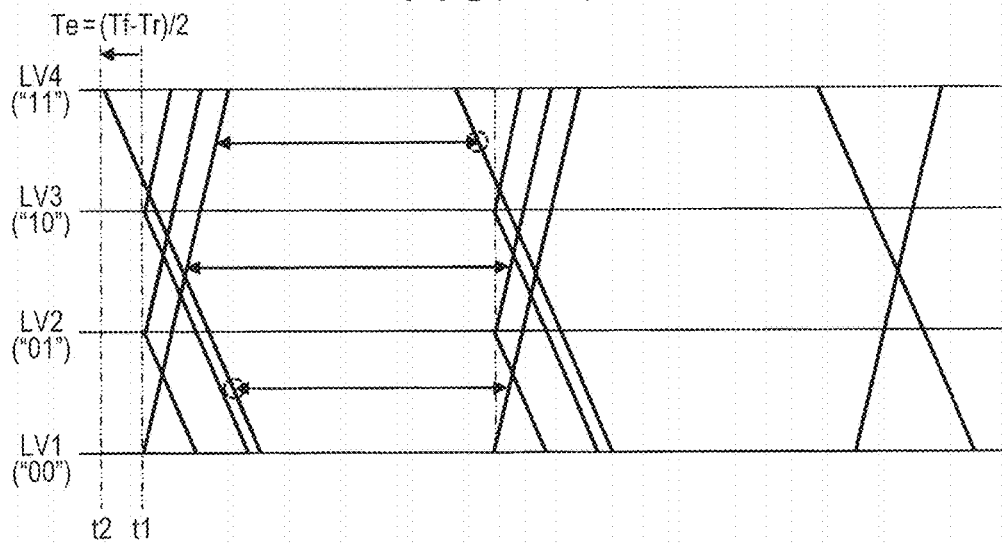
FIG. 10 schematically illustrates a waveform of laser light output from a semiconductor laser in an optical driving device according to a second embodiment of the present invention.

FIG. 10 schematically illustrates a waveform of laser light output from a semiconductor laser in an optical driving device according to a second embodiment of the present invention. The waveform illustrated in FIG. 10 is different from the waveform illustrated in FIG. 4B in a waveform of each of transitions from the fourth level LV4 to the third level LV3 and the second level LV2. That is, in a case of FIG. 4B, a clock control circuit only determines a driving timing in association with a transition from the fourth level LV4 to the first level LV1 to be a timing t2. Meanwhile, in a case of FIG. 10, a clock control circuit determines all driving timings in association with transitions from the first, second, or third level (any of LV1, LV2, and LV3) to other levels to be a timing t1, and determines driving timings in association with transitions from the fourth level LV4 to other levels (LV1, LV2, and LV3) to be a timing t2.

Figure 11:
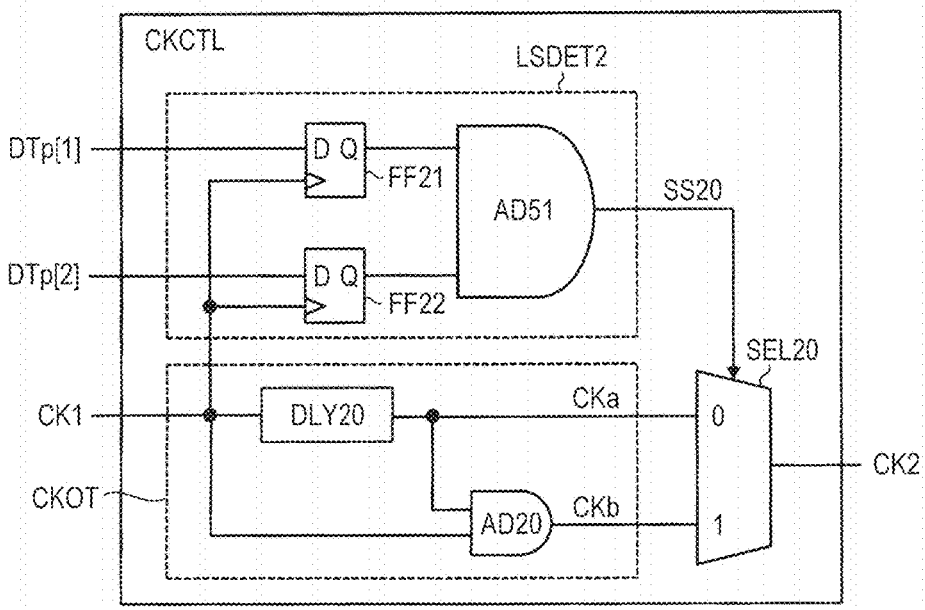
FIG. 11 is a circuit diagram illustrating a configuration example of a clock control circuit corresponding to FIG. 10.

FIG. 11 is a circuit diagram illustrating a configuration example of the clock control circuit corresponding to FIG. 10. The clock control circuit CKCTL illustrated in FIG. 11 is different from the configuration example in FIG. 6A in the configuration of a level-transition detection circuit LSDET2. The level-transition detection circuit LSDET2 includes flip-flop circuits FF21 and FF22 and an AND gate AD51 that performs an AND operation of outputs of the flip-flop circuits FF21 and FF22. Thus, the level-transition detection circuit LSDET2 detects a clock cycle in which a transition from the fourth level LV4 to another level occurs. That is, when parallel data (DTp[1] and DTp[2]) in a previous clock cycle is (1, 1), the level-transition detection circuit LSDET2 asserts a selection signal SS20 to be at level '1' irrespective of parallel data in a current clock cycle, thereby making a falling edge of a clock signal CK2 earlier.

<<Main Advantageous Effects of Second Embodiment>>

By using the method of the second embodiment in the aforementioned manner, similar advantageous effects to those of the first embodiment are obtained. Further, as is found from comparison of FIGS. 4A and 10, the size of an intermediate eye can be increased. Therefore, further improvement of signal quality of laser light may be achieved.

In the above, the invention made by the inventors of the present application has been specifically described by way of the embodiments. However, the present invention is not limited to the aforementioned embodiments, and can be changed in various ways within the scope not departing from the gist thereof. For example, the aforementioned embodiments are described in detail for the purpose of clearly explaining the present invention. However, the present invention is not necessarily limited to include all the described components. In addition, a portion of the configuration of a certain embodiment can be replaced with the configuration of another embodiment. Also, the configuration of the other embodiment can be added to the configuration of the certain embodiment. Further, addition can be made for a portion of the configuration of each of the aforementioned embodiments, or a portion of the configuration of each of the aforementioned embodiments can be deleted or replaced with another configuration.

What is claimed is:

1. An optical driving device that drives a direct modulation type semiconductor laser, comprising:
a laser driver that drives the semiconductor laser by using an N-level (N is an integer of 3 or more) PAM (Pulse Amplitude Modulation) signal; and
a clock control circuit that determines a driving timing of the laser driver,
wherein the clock control circuit determines the driving timing in association with a transition from an N-th level to a first level to be earlier than the driving timing in association with a transition from the first level to the N-th level by a first time, assuming that N levels are the first level, a second level, . . . , and the N-th level in an order from a level at which light intensity is minimum.

2. The optical driving device according to claim 1,
wherein the N levels are four levels.

3. The optical driving device according to claim 2,
wherein the first time is "(Tf−Tr)/2", assuming that a time required for the transition from the N-th level to the first level is "Tf" and a time required for the transition from the first level to the N-th level is "Tr".

4. The optical driving device according to claim 2,
wherein the clock control circuit determines all the driving timings in association with transitions except for the transition from a fourth level to the first level to be a first timing, and determines the driving timing in association with the transition from the fourth level to the first level to be a second timing earlier than the first timing by the first time.

5. The optical driving device according to claim 4,
wherein the clock control circuit includes
a clock output circuit that includes a delay circuit determining the first time, and outputs a first clock signal corresponding to the first timing and a second clock signal corresponding to the second timing,
a selection circuit that selects one of the first clock signal and the second clock signal, and
a detection circuit that detects a clock cycle in which the transition from the fourth level to the first level occurs, and controls the selection circuit with the detection result.

6. The optical driving device according to claim 5,
wherein the delay circuit is a variable delay circuit that is able to variably set the first time.

7. The optical driving device according to claim 2,
wherein the clock control circuit determines all the driving timings in association with transitions from the first level, the second level, or the third level to other levels to be a first timing, and determines the driving timings in association with transitions from the fourth level to other levels to be a second timing earlier than the first timing by the first time.

8. The optical driving device according to claim 7,
wherein the clock control circuit includes
a clock output circuit that includes a delay circuit determining the first time, and outputs a first clock signal corresponding to the first timing and a second clock signal corresponding to the second timing,
a selection circuit that selects one of the first clock signal and the second clock signal, and a detection circuit that detects a clock cycle in which a transition from the fourth level to another level occurs, and controls the selection circuit with the detection result.

9. An optical communication system comprising:

an optical fiber;

an optical transmission device that converts digital data to a four-level PAM (Pulse Amplitude Modulation) signal and transmits laser light modulated with the PAM signal to the optical fiber; and an optical receiving device that receives the laser light from the optical fiber and demodulates the laser light, wherein the optical transmission device includes a direct modulation type semiconductor laser, a laser driver that drives the semiconductor laser by using the PAM signal, and a clock control circuit that determines a driving timing of the laser driver, and wherein the clock control circuit and determines the driving timing in association with a transition from a fourth level to a first level to be earlier than the driving timing in association with a transition from the first level to the fourth level by a first time, assuming that four levels are the first level, a second level, a third level, and the fourth level in an order from a level at which light intensity is minimum.

10. The optical communication system according to claim 9, wherein the first time is "(Tf−Tr)/2", assuming that a time required for the transition from the fourth level to the first level is "Tf" and a time required for the transition from the first level to the fourth level is "Tr".

11. The optical communication system according to claim 9, wherein the clock control circuit determines all the driving timings in association with transitions except for the transition from the fourth level to the first level to be a first timing, and determines the driving timing in association with the transition from the fourth level to the first level to be a second timing earlier than the first timing by the first time.

12. The optical communication system according to claim 11, wherein the clock control circuit includes a clock output circuit that includes a delay circuit determining the first time, and outputs a first clock signal corresponding to the first timing and a second clock signal corresponding to the second timing, a selection circuit that selects one of the first clock signal and the second clock signal, and a detection circuit that detects a clock cycle in which the transition from the fourth level to the first level occurs, and controls the selection circuit with the detection result.

13. The optical communication system according to claim 12, wherein the delay circuit is a variable delay circuit that is able to variably set the first time.

14. The optical communication system according to claim 9, wherein the clock control circuit determines all the driving timings in association with transitions from the first level, the second level, or the third level to other levels to be a first timing, and determines the driving timings in association with transitions from the fourth level to other levels to be a second timing earlier than the first timing by the first time.

15. The optical communication system according to claim 14, wherein the clock control circuit includes a clock output circuit that includes a delay circuit determining the first time, and outputs a first clock signal corresponding to the first timing and a second clock signal corresponding to the second timing, a selection circuit that selects one of the first clock signal and the second clock signal, and a detection circuit that detects a clock cycle in which a transition from the fourth level to another level occurs, and controls the selection circuit with the detection result.

* * * * *